(12) United States Patent
Mathieu

(10) Patent No.: US 11,837,781 B2
(45) Date of Patent: Dec. 5, 2023

(54) METHOD FOR MANUFACTURING AN ANTENNA

(71) Applicant: NetComm Wireless Pty Ltd, Lane Cove (AU)

(72) Inventor: Paul Mathieu, Lane Cove (AU)

(73) Assignee: NetComm Wireless Pty Ltd, Lane Cove (AU)

( * ) Notice: Subject to any disclaimer, the term of this patent is extended or adjusted under 35 U.S.C. 154(b) by 0 days.

(21) Appl. No.: 17/692,839

(22) Filed: Mar. 11, 2022

(65) Prior Publication Data

US 2022/0200140 A1    Jun. 23, 2022

Related U.S. Application Data

(60) Division of application No. 17/077,675, filed on Oct. 22, 2020, now Pat. No. 11,329,372, and a (Continued)

(30) Foreign Application Priority Data

Apr. 23, 2018  (AU) ................................ 2018901335

(51) Int. Cl.
*H01Q 1/42*    (2006.01)
*H01Q 1/12*    (2006.01)

(52) U.S. Cl.
CPC ................. *H01Q 1/42* (2013.01); *H01Q 1/12* (2013.01)

(58) Field of Classification Search
CPC .......... H01Q 1/12; H01Q 1/1207; H01Q 1/20; H01Q 1/40; H01Q 1/405; H01Q 1/42; H01Q 1/422; H05K 5/06–065
See application file for complete search history.

(56) References Cited

U.S. PATENT DOCUMENTS 4,804,972 A * 2/1989 Schudel ................... H01Q 1/42
                                                         343/915
5,757,327 A * 5/1998 Yajima ................. H01Q 1/3233
                                                         343/872

(Continued)

FOREIGN PATENT DOCUMENTS

DE         4106077 A1    9/1992
EP         1717900 B1    3/2009
(Continued)

OTHER PUBLICATIONS

U.S. Appl. No. 17/077,675, Notice of Allowance dated Feb. 2, 2022, 10 pages.

(Continued)

*Primary Examiner* — Jason Crawford
(74) *Attorney, Agent, or Firm* — Kilpatrick Townsend & Stockton LLP

(57) ABSTRACT

A method of manufacturing an antenna using a radome (10) comprising a front portion (30) and a rear portion (20), the front and rear portions (20, (30) configured to define an interior cavity in which an antenna arrangement is received, the method comprising placing an antenna panel on an inside of one of the front and rear portions, and bringing the portions together, whereby the front portion (30) includes a peripheral channel region (31) configured to contain an adhesive sealant (60) and receive a peripheral edge (21) of the rear portion (20) that is partially submerged in the adhesive sealant (60) before it cures. Additional mechanical fastening clip engagement members (23; 33) are provided inside both the front and rear portions (20; 30) that engage with one another and mechanically secure the radome front and rear portions (20; 30) to each other, in addition to the adhesive joint provided by the adhesive sealant (60) once cured.

23 Claims, 10 Drawing Sheets

Related U.S. Application Data continuation of application No. PCT/AU2019/050349, filed on Apr. 18, 2019.

(56) References Cited

U.S. PATENT DOCUMENTS

| | | | | |
|---|---|---|---|---|
| 5,900,840 | A * | 5/1999 | Yajima | H01Q 21/061 343/872 |
| 6,788,264 | B2 * | 9/2004 | Du | H01Q 9/0435 343/726 |
| 6,930,643 | B2 * | 8/2005 | Byrne | H01Q 1/3275 343/702 |
| 7,004,666 | B2 * | 2/2006 | Kozlovski | H01Q 1/3275 403/197 |
| 7,138,958 | B2 | 11/2006 | Syed et al. | |
| 7,429,958 | B2 | 9/2008 | Lindackers et al. | |
| 7,528,794 | B2 * | 5/2009 | Zurowski | H01Q 1/3275 343/878 |
| 7,768,465 | B2 * | 8/2010 | Jared | H01Q 9/0414 343/872 |
| 8,222,526 | B2 | 7/2012 | Bresney et al. | |
| 8,537,062 | B1 * | 9/2013 | Duzdar | H01Q 1/3275 343/878 |
| 8,855,730 | B2 * | 10/2014 | Sanford | H01Q 21/065 455/90.3 |
| 9,799,951 | B2 * | 10/2017 | Sawaya | H01Q 1/42 |
| 10,158,169 | B1 * | 12/2018 | Venghaus | H01Q 1/088 |
| 10,374,302 | B2 * | 8/2019 | Kobayashi | H01Q 1/1214 |
| 11,329,372 | B2 * | 5/2022 | Mathieu | H01Q 1/1207 |
| 2003/0068198 | A1 * | 4/2003 | Kozlovski | H01Q 1/3275 403/372 |
| 2003/0094770 | A1 * | 5/2003 | Gomez | F16J 15/025 277/626 |
| 2005/0093755 | A1 * | 5/2005 | Byrne | H01Q 1/27 343/713 |
| 2006/0244667 | A1 * | 11/2006 | Thompson | H01Q 1/3275 343/700 MS |
| 2006/0290580 | A1 * | 12/2006 | Noro | H01Q 1/3275 343/715 |
| 2007/0103374 | A1 * | 5/2007 | Lindackers | H01Q 1/3275 343/872 |
| 2008/0111752 | A1 * | 5/2008 | Lindackers | H01Q 5/371 343/872 |
| 2008/0122708 | A1 * | 5/2008 | Lindackers | H01Q 1/1214 343/713 |
| 2008/0252552 | A1 * | 10/2008 | Goebel | H01Q 1/42 343/872 |
| 2010/0277379 | A1 * | 11/2010 | Lindackers | H01Q 1/3275 343/878 |
| 2010/0315301 | A1 * | 12/2010 | Marten | H01Q 1/42 174/59 |
| 2011/0221626 | A1 * | 9/2011 | Hill | G01S 13/933 244/129.1 |
| 2011/0221640 | A1 * | 9/2011 | Huber | H01Q 1/3275 343/713 |
| 2013/0229315 | A1 * | 9/2013 | Duzdar | H01Q 9/0407 343/713 |
| 2014/0292593 | A1 * | 10/2014 | Thiam | H01Q 9/32 343/893 |
| 2014/0360667 | A1 * | 12/2014 | Schmier, II | H01Q 1/42 156/60 |
| 2016/0036121 | A1 * | 2/2016 | Hayashi | H01Q 1/42 343/713 |
| 2016/0064807 | A1 * | 3/2016 | Reed | H01Q 21/28 343/749 |
| 2016/0104932 | A1 * | 4/2016 | Aminzadeh | H01Q 5/40 343/872 |
| 2017/0149124 | A1 * | 5/2017 | Fabre | H01Q 1/3291 |
| 2017/0317407 | A1 * | 11/2017 | Yasin | H01Q 1/3275 |
| 2018/0083348 | A1 * | 3/2018 | Thiam | H01Q 5/371 |
| 2018/0159208 | A1 * | 6/2018 | Ameri | H01Q 9/0414 |
| 2018/0351243 | A1 * | 12/2018 | Lewis | H01Q 1/282 |
| 2020/0381831 | A1 * | 12/2020 | Milroy | H01Q 21/10 |
| 2020/0381842 | A1 * | 12/2020 | Milroy | H01Q 3/04 |
| 2021/0044008 | A1 * | 2/2021 | Mathieu | H01Q 1/12 |
| 2021/0098867 | A1 * | 4/2021 | Gomez | H01Q 1/42 |
| 2022/0200140 | A1 * | 6/2022 | Mathieu | H01Q 1/12 |

FOREIGN PATENT DOCUMENTS

| | | |
|---|---|---|
| JP | 07167326 A | 7/1995 |
| JP | 07109962 B2 | 11/1995 |

OTHER PUBLICATIONS

European Application No. 19793675.0, Extended European Search Report dated Apr. 16, 2021, 10 pages.
International Application No. PCT/AU2019/050349, International Preliminary Report on Patentability dated Apr. 23, 2020, 13 pages.
International Application No. PCT/AU2019/050349, International Search Report and Written Opinion dated May 29, 2019, 9 pages.

* cited by examiner

METHOD FOR MANUFACTURING AN ANTENNA

CROSS-REFERENCES TO RELATED APPLICATIONS

This application is a divisional application of U.S. patent application Ser. No. 17/077,675 entitled "LIGHTWEIGHT RADOME FOR HOUSING AN ANTENNA," filed on Oct. 22, 2020, which is a continuation application of International Patent Application No. PCT/AU2019/050349 entitled "LIGHTWEIGHT RADOME FOR HOUSING AN ANTENNA," filed on Apr. 18, 2019, which claims priority to Australian Patent Application No. 2018901335, filed on Apr. 23, 2018, all of which are herein incorporated by reference in their entirety for all purposes.

FIELD OF THE INVENTION

The present invention relates to a method for manufacturing an antenna using a lightweight radome.

BACKGROUND OF THE INVENTION

Antennas include delicate components that may be damaged when exposed to ambient conditions. Therefore, antennas are often housed in radomes that prevent physical matter, such as debris, precipitation, moving air and the like, from coming into direct physical contact with antenna components. As such, a radome functions as a physical barrier to potentially damaging matter, while still permitting the propagation of electromagnetic radiation, particularly radio waves, to and from the protected antenna.

An antenna is typically housed in a radome that is transparent to radio waves over a frequency band dictated by the operational requirements of the antenna.

Existing radomes are susceptible to aging damage due to environmental conditions, as well as stress when exposed to high loads.

A heavier construction of a radome increases radio frequency (RF) transmission losses, decreases receiving sensitivity, and thus requires an increase in the transmission power or the size of the antenna, at a great cost.

BRIEF SUMMARY OF THE INVENTION

The inventive concept arises from a recognition that a method of manufacturing an antenna using a radome which is lighter than prior radomes and continues to provide a structurally robust housing and a waterproof seal for an antenna housed within it, is highly desirable.

It is also advantageous to provide an antenna unit or module that is simple, convenient and fast for an installer to mount at an installation site.

The present invention, in one aspect, is a method for manufacturing an antenna, comprising: providing a monocoque front housing-half having a peripheral lower edge; providing a monocoque rear housing-half having a peripheral upper edge and configured to mate with the front housing half in forming a radome with a hollow interior for an antenna arrangement, wherein the front housing-half peripheral edge is shaped to define a channel configured to receive the rear housing-half peripheral edge; positioning an antenna panel on an inner surface of either the front or rear housing-half; applying an adhesive sealant in the front housing-half peripheral channel; aligning the rear housing-half with the front housing-half such that the rear housing-half peripheral edge coincides with the front housing-half peripheral channel during the process of mating the front and rear housing halves, preferably by means of a plurality of alignment pins of either or both the front housing-half or the rear housing-half; moving the rear and front housing-halves towards each other thereby at least partially submerging the rear housing-half peripheral edge in the adhesive sealant received in the front housing-half peripheral channel region to form a waterproof seal and adhesively bond the rear and front housing-halves to each other once the adhesive sealant has cured; and fully closing the radome following mating of the front and rear housing halves by causing at least one first clip engagement member of and within the front housing-half to mechanically engage with at least one corresponding second clip engagement member of and within the rear-housing half, thereby mechanically securing the front and rear housing-halves to each other in addition to the adhesive bonding provided by the adhesive sealant.

In embodiments of the invention, a plurality of alignment pins configured to align the front and rear housing parts are provided on at least one of the front and rear housing parts, the alignment pins arranged and configured to prevent accidental contact of the rear housing-half peripheral edge with the sealant unless there is alignment in the process of mating the front and rear housing halves.

In embodiments of the invention, the first and/or second clip engagement members may advantageously have a lower height than the alignment pins to such extent that alignment of the front housing part to the rear housing part occurs before mechanical engagement of the clip engagement members is initiated.

Advantageously, the method further comprises fastening the antenna panel through holes in the rear housing half to cause clamping of the antenna panel between the front and rear housing halves.

In embodiments of the invention, the method can further comprise fitting and securing a rear casting into a receptacle region provided on an outer surface of the rear housing-half, wherein the rear casting is fitted and secured into the receptacle region such as to close the through holes.

In embodiments of the invention, the method can further comprise positioning a compressible and/or deformable seal between a lower surface of a peripheral edge of the rear casting and the receptacle region of the rear housing-half before fitting and securing the rear casting, such as to provide a waterproof seal between the lower surface of the rear casting and the upper surface of the rear housing half.

In embodiments of the invention, securing the rear casting into the receptacle region provided on the outer surface of the rear housing-half comprises the use of screws.

In embodiments of the invention, the method further comprises connecting an adjustable mounting bracket to the rear casting either before or after the rear casting is secured to the rear housing-half, the mounting bracket configured to affix the radome to a pole to mount the antenna to the pole.

In embodiments of the invention, the front housing-half peripheral channel is a substantially U-shaped channel and the rear housing-half peripheral edge extends from an inner surface of the rear housing-half and is set back from an outer surface of the rear housing-half, the U-shaped channel and the peripheral edge being complimentarily formed in such fashion that when the peripheral edge is inserted into the U-shaped channel, the adhesive sealant is displaced to surround opposite faces of the peripheral edge to form a waterproof seal.

In advantageous embodiments, the rear housing-half peripheral edge is formed such that it is biased or inclined with respect to an outer side of the U-shaped channel whereby inserting of the peripheral edge into the U-shaped channel causes excess sealant received in the U-shaped channel to be pushed inwards towards the hollow interior of the radome, thereby resulting in a clean finish on an exterior surface of the radome where the front and rear housing-halves meet when the radome is closed.

In other advantageous embodiments, the U-shaped channel is formed with a blind end having a stepped portion and forming the peripheral edge with a terminal base such that (i) inserting of the peripheral edge into the U-shaped channel causes excess sealant received in the U-shaped channel to be pushed inwardly towards the hollow interior of the radome, and (ii) when fully inserted into the U-shaped channel, the peripheral edge base abuts the stepped portion when the radome is fully closed.

In some embodiments, Room-Temperature-Vulcanizing (RTV) silicone material is used as the adhesive sealant.

It will become apparent to those of ordinary skill reading this disclosure that the above mentioned embodiments provide certain advantages and are not limiting of the invention, rather provide variations/additions to the basic inventive concept disclosed herein.

BRIEF DESCRIPTION OF THE DRAWINGS

Exemplary, and therefore non-limiting, embodiments of the invention will be described with respect to the figures, in which like reference numbers denote like elements and in which.

DETAILED DESCRIPTION OF THE INVENTION

Figure 1:
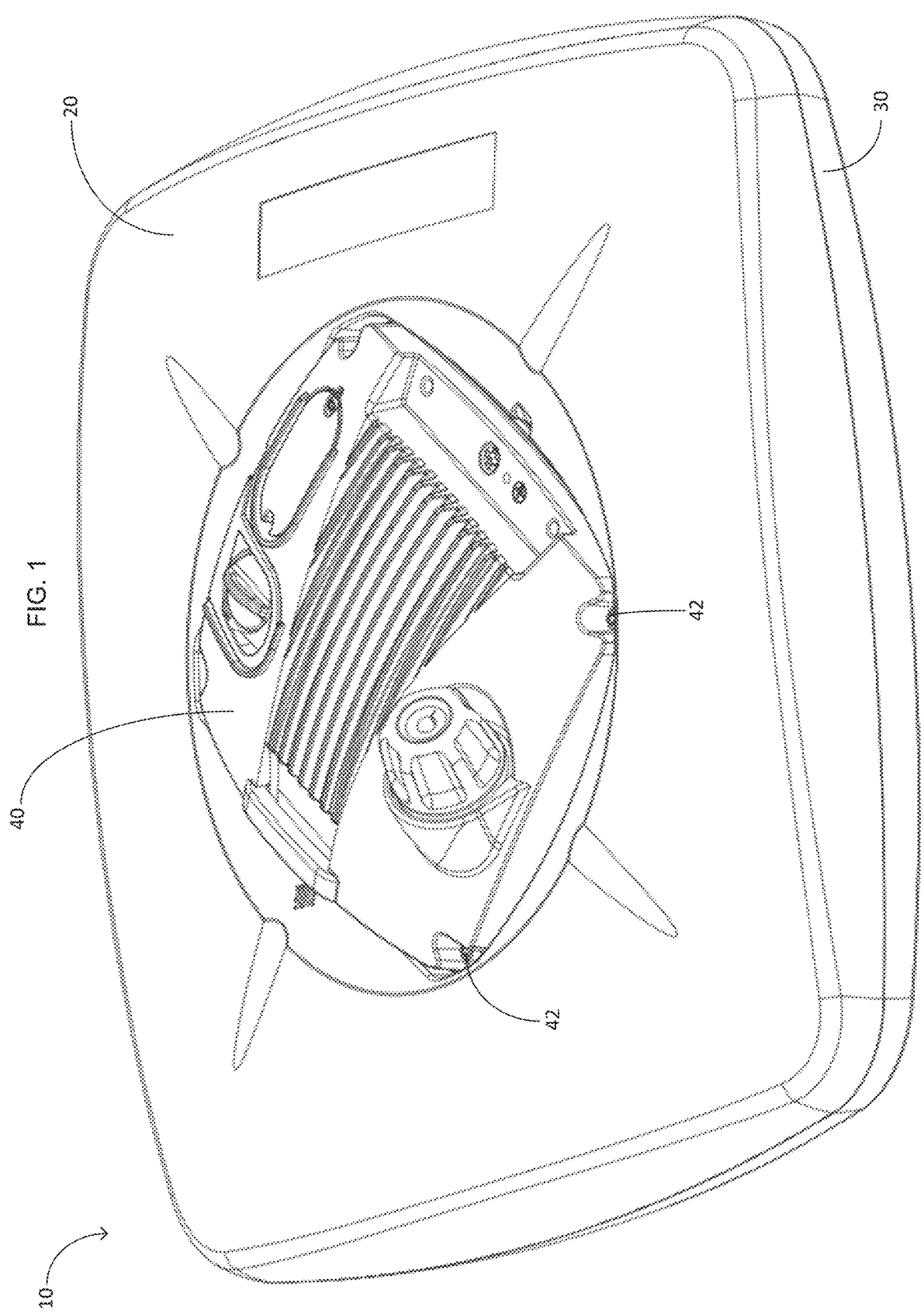
FIG. 1 is a perspective view of the rear side of a radome housing an antenna manufactured in accordance with a preferred embodiment of the present invention.
Figure 2:
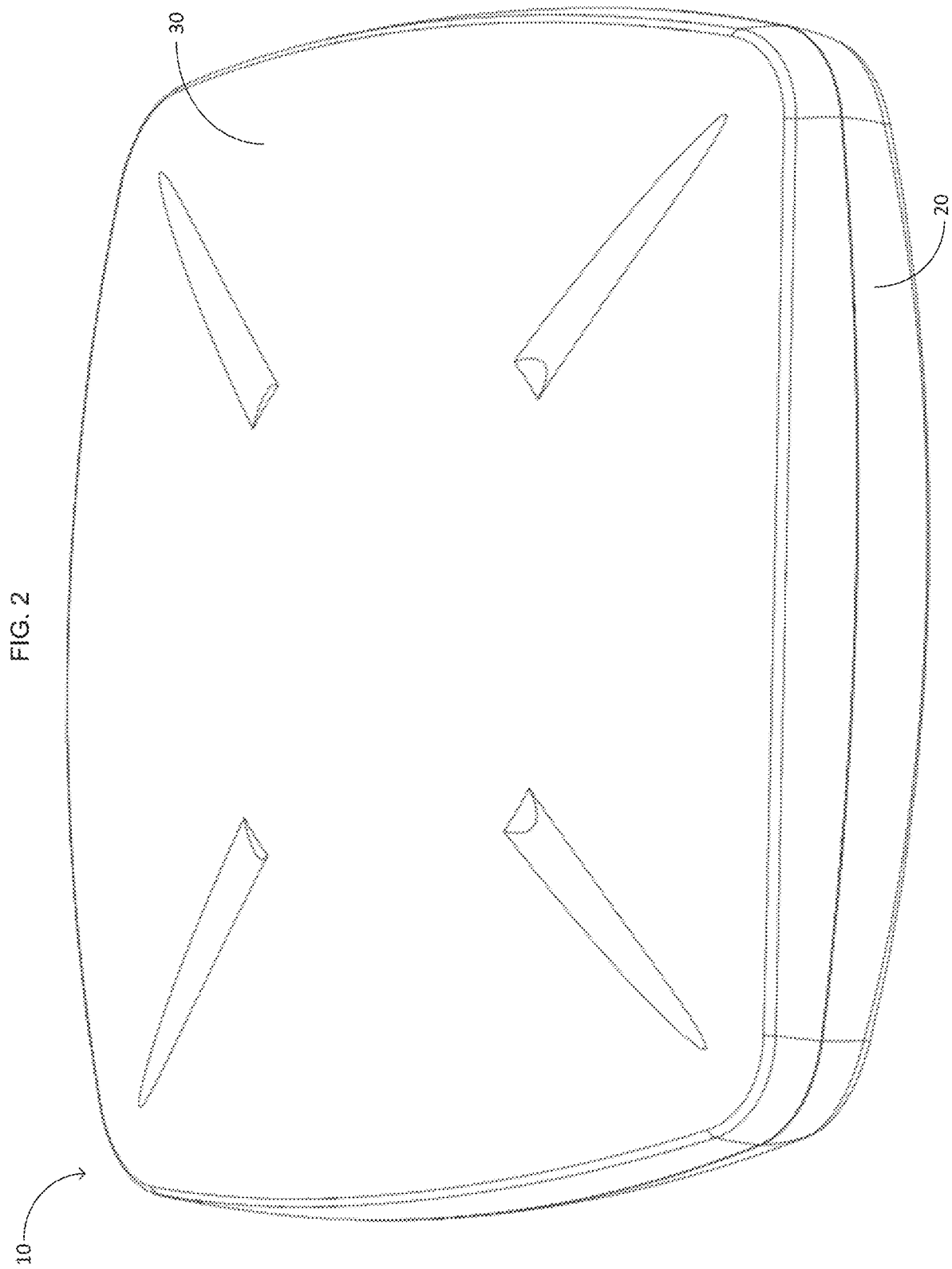
FIG. 2 is a perspective view of the front side of the radome of FIG. 1.

The present invention provides a method for manufacturing an antenna using a lightweight radome. A preferred radome for this purpose is illustrated in FIG. 1 and shown generally at reference numeral 10.

Figure 3:
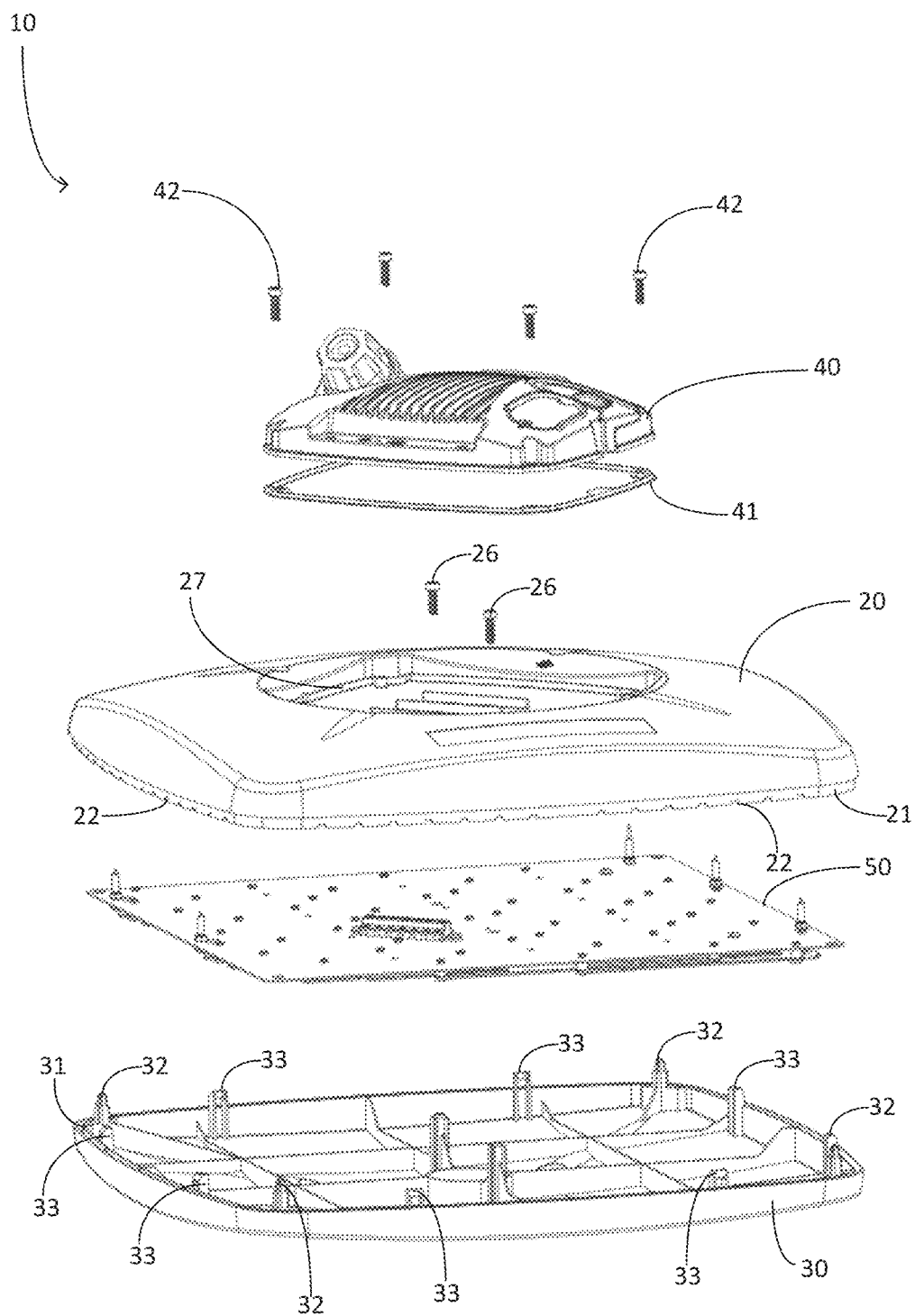
FIG. 3 is an exploded view of the radome of FIG. 1 illustrating location of an antenna panel received within the radome.

Referring to FIG. 3, the radome 10 is devised for housing an antenna panel 50. The radome 10 comprises a front portion or housing-half 30. The radome 10 also comprises a rear portion or housing-half 20 configured to mate with the front portion 30. The front and rear portions 20, 30 may considered respective halves of the radome 10. The front portion 30 includes a peripheral channel region 31 encircling the housing half, configured to contain an adhesive sealant 60 (see FIGS. 6 and 8) and receive a peripheral edge 21 of and encircling the rear portion 20 that is partially submerged or immersed in the adhesive sealant 60 before it cures. After mating the rear portion 30 to the front portion 20, two screws 26 are screwed through respective screw holes in the rear portion 20 to firmly clamp the antenna panel 50, received within the cavity defined by the housing-halves 20, 30, between the radome halves 20, 30. The screws 60 are not visible after a rear casting 40 is fitted into a receptacle region 27 provided on the outer surface of the rear portion 20. In another embodiment, the screws 26 may be not necessary in order to firmly clamp the antenna panel 50 between the radome halves 20, 30.

The radome 10 has a monocoque construction to reduce weight and still maintain structural integrity. The front and rear portions 20, 30 support their load by distributing tension and compression across the surface of the front and rear portions 20, 30. In one embodiment, the bonded radome 10 has a 10% thinner wall section than prior radomes, specifically 2.7 mm wall thickness instead of 3.0 mm. The size dimension of the front and rear portions 20 varies depending on the shape and design of the antenna panel 50.

Preferably, the adhesive sealant 60 is a Room-Temperature-Vulcanizing (RTV) silicone material. The adhesive sealant 60 is a plastic adhesive with good flame resistance that can cure at room temperature. The adhesive sealant 60 is applied as a sealing bead within the peripheral channel region 31 using an automatic applicator machine. A sufficient quantity of adhesive sealant 60 is applied by the automatic applicator machine such that the insertion of the peripheral edge 21 into the adhesive sealant 60 contained in the peripheral channel region 31 creates a waterproof seal and impermeable barrier. For example, the adhesive sealant 60 contained in the peripheral channel region 31 results in three surfaces of the peripheral edge 21 to be surrounded by and in contact with the adhesive sealant 60.

The peripheral edge 21 of the rear portion 20 is castellated or scalloped to increase bonding surface area of the peripheral edge 21 with the sealant 60. In one example, a series of small cut-outs 22 are defined along the peripheral edge 21.

Figure 5:
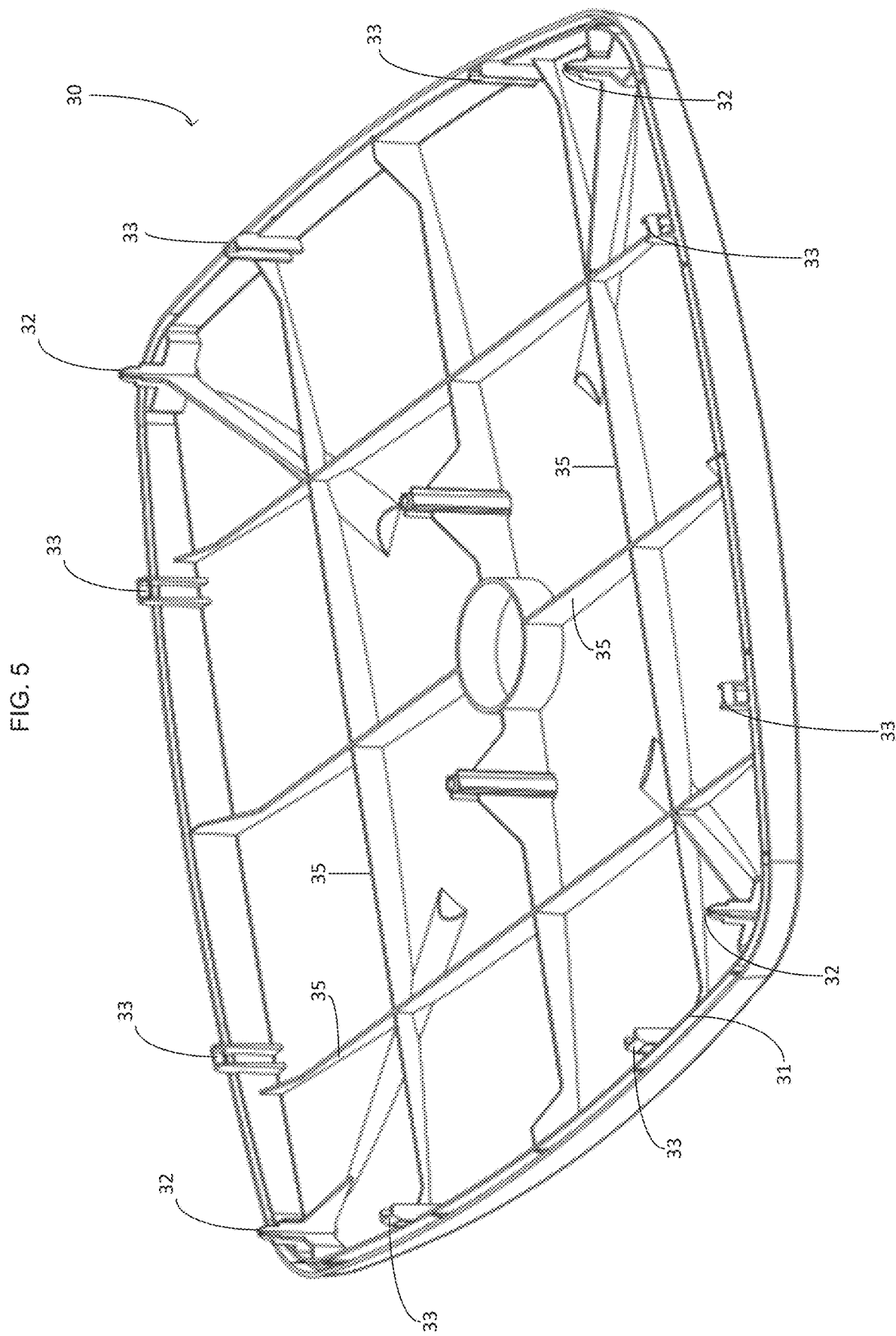
FIG. 5 is a front housing half of the radome of FIG. 1.

Referring to FIG. 5, the front portion 30 includes a plurality of alignment pins 32 configured to align the front portion 30 to the rear portion 20. This prevents accidental contact of the peripheral edge 21 with the sealant 60 unless there is alignment between the front and rear portions 20, 30. The alignment pins 32 also provide ease of assembly of the front and rear portions 20, 30.

Figure 4:
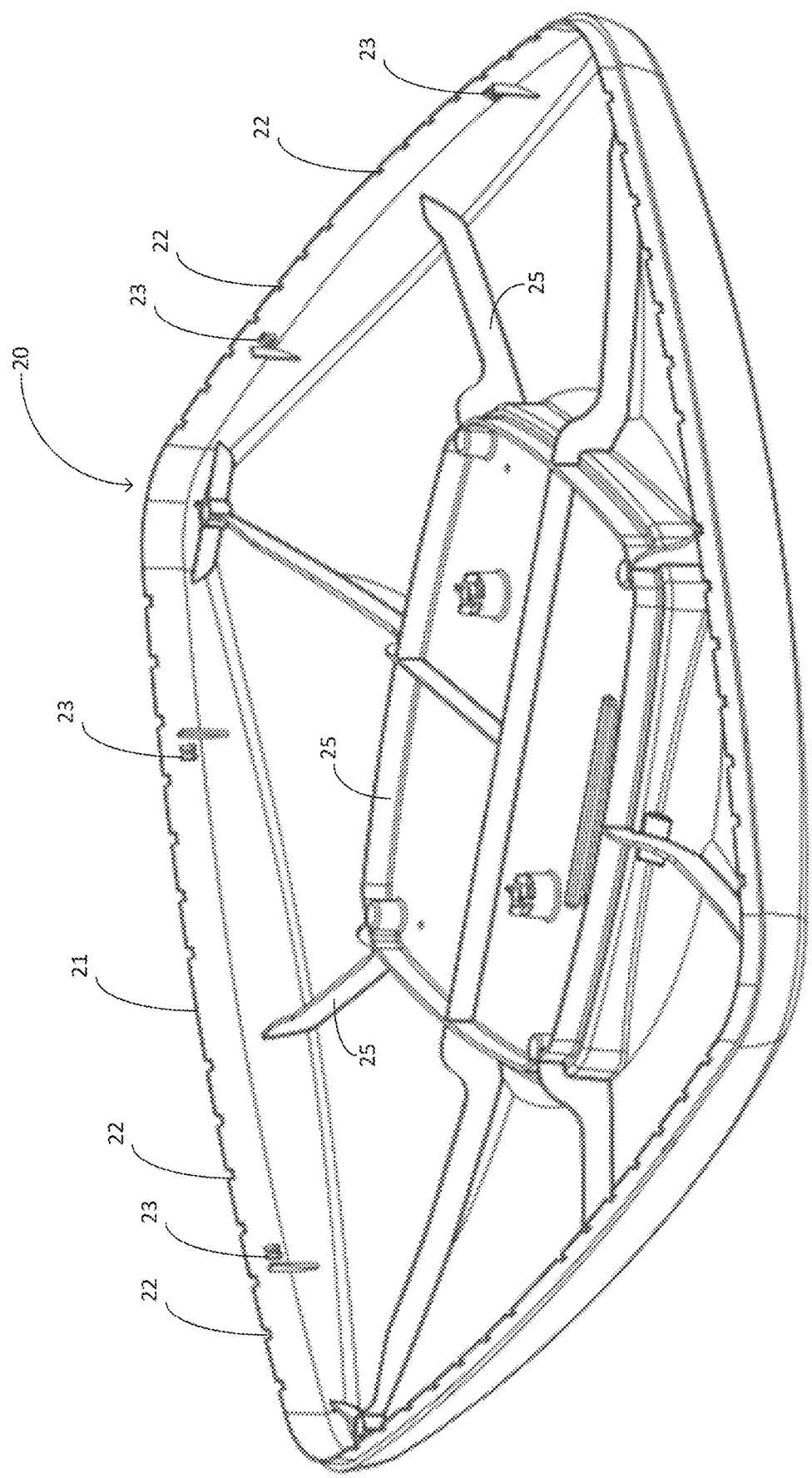
FIG. 4 is a rear housing half of the radome of FIG. 1.

The front portion 30 also includes a plurality of first clip engagement members 33. Turning to FIG. 4, the rear portion 20 includes a plurality of second clip engagement members 23 configured to mechanically engage with the first clip engagement members 33 and mechanically secure the front portion 30 with the rear portion 20. There may be six first clip engagement members 33 where there are two first clip engagement members 33 for each side of the front portion 30. There may be six second clip engagement members 23 where there are two second clip engagement members 23 for each side of the rear portion 20. The use of the clip engagement members 23, 33 provides mechanical retention in addition to the bonding and sealing provided by the sealant 60 surrounding the peripheral edge 21 in the peripheral channel region 31. The clips 23, 33 are internal clips that are preferably located on internal surfaces of the front and rear portions 20, 30 to not be externally visible. This provides a visually aesthetic finish producing a smooth outer side surface for the radome 10 and reduces the opportunity for unauthorised opening of the radome 10 or tampering. Also locating the clips 23, 33 protects them from accidental or intentionally external damage compared to externally disposing them, which could eventually lead to the front and rear portions 20, 30 separating under certain conditions.

The first clip engagement members 33 have a lower height than the alignment pins 32 such that alignment of the front portion 30 to the rear portion 20 occurs before mechanical engagement of the clip engagement members 23, 33 is possible.

Figure 6:
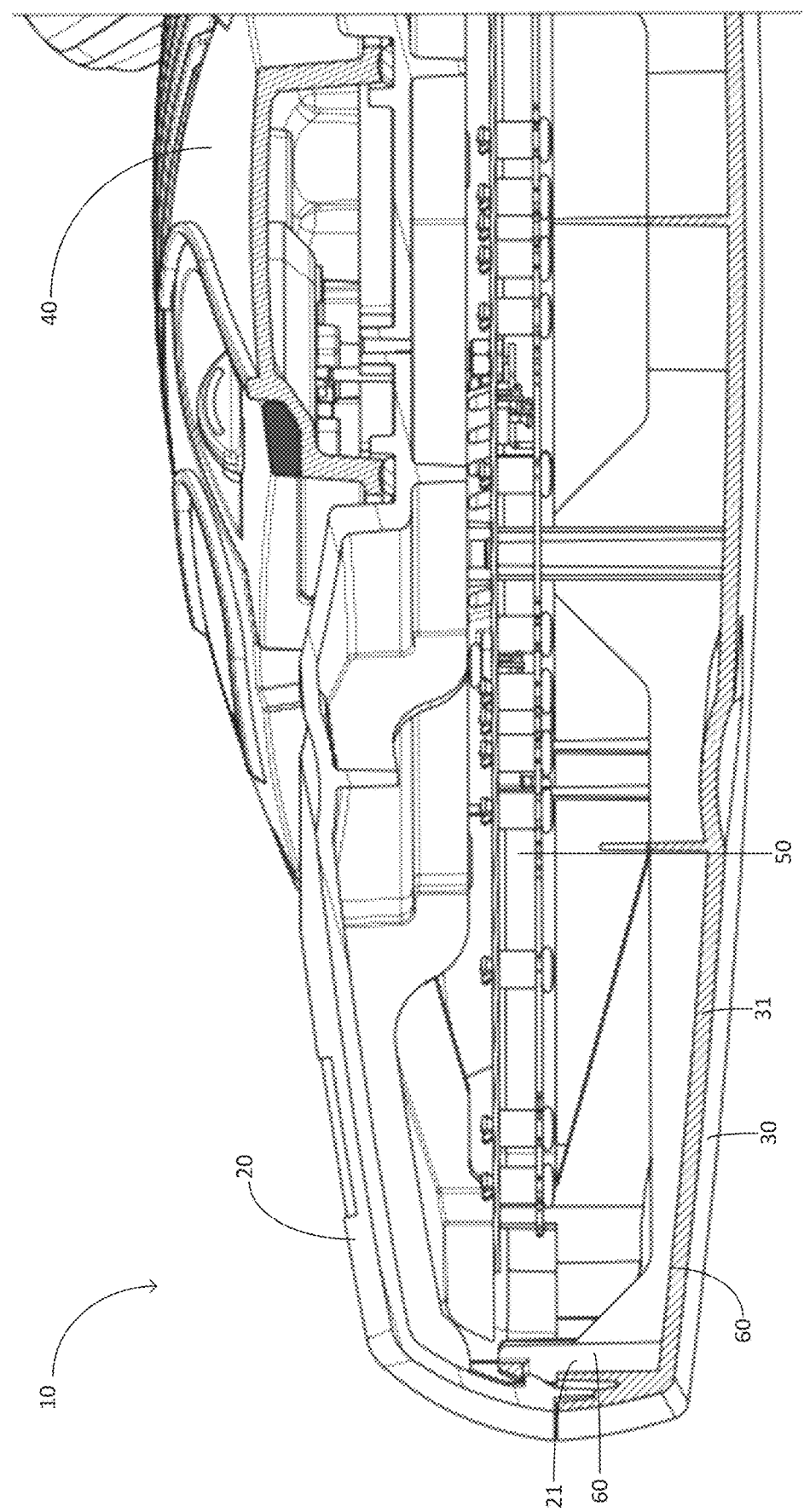
FIG. 6 is a sectional side view of part of the radome of FIG. 1.
Figure 7:
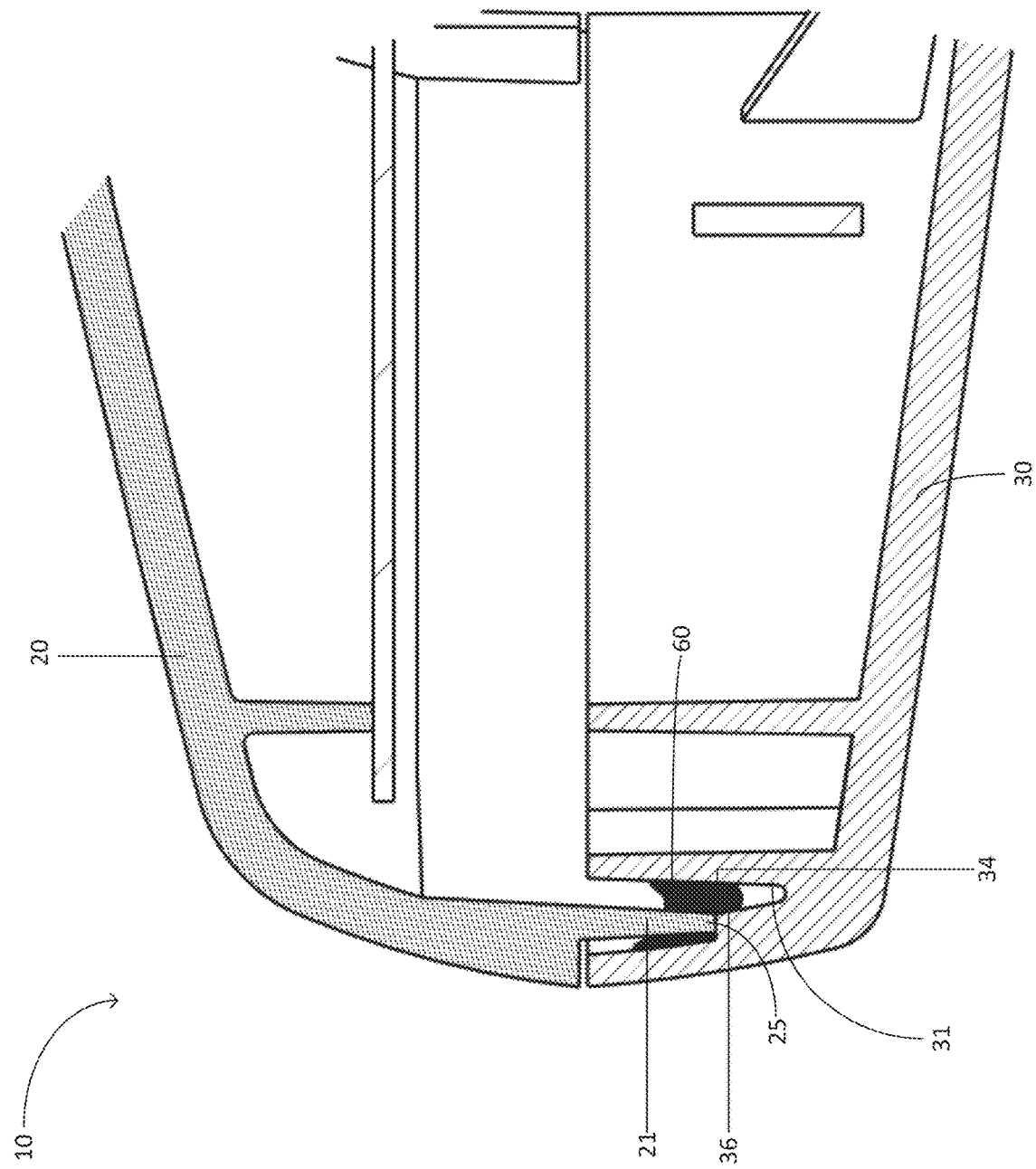
FIG. 7 is a zoomed in sectional side view of part of the radome of FIG. 1 depicting the location of an adhesive sealant.

Referring to FIGS. 6 and 7, in one embodiment, the peripheral channel region 31 has a blind end comprising a stepped portion 36 (see FIG. 7). The peripheral edge 21 extends from an inner surface of the rear portion 20 and is set back from the outer surface of the rear portion 20. A base 25 of the peripheral edge 21 of the rear portion 20 is configured to abut against the stepped portion 36. When the peripheral edge 21 is inserted into the peripheral channel region 31, the adhesive sealant 60 is displaced to surround three surfaces of the peripheral edge 21 which forms a waterproof seal. The angle of the peripheral edge 21 is biased or inclined to the outer side of the peripheral channel region 31 so that any excess sealant 60 is pushed inwards resulting in a clean finish on the exterior surface of the radome where the two halves 20, 30 meet rather than potentially leaving random blobs of unsightly sealant 60 visible. Also, the abutment of the base 25 of the peripheral edge 21 with the stepped portion 36 in the peripheral channel region 31 causes excess adhesive sealant 60 to be displaced our pushed inwardly towards an inner wall surface 34 of the peripheral channel region 31.

Figure 8:
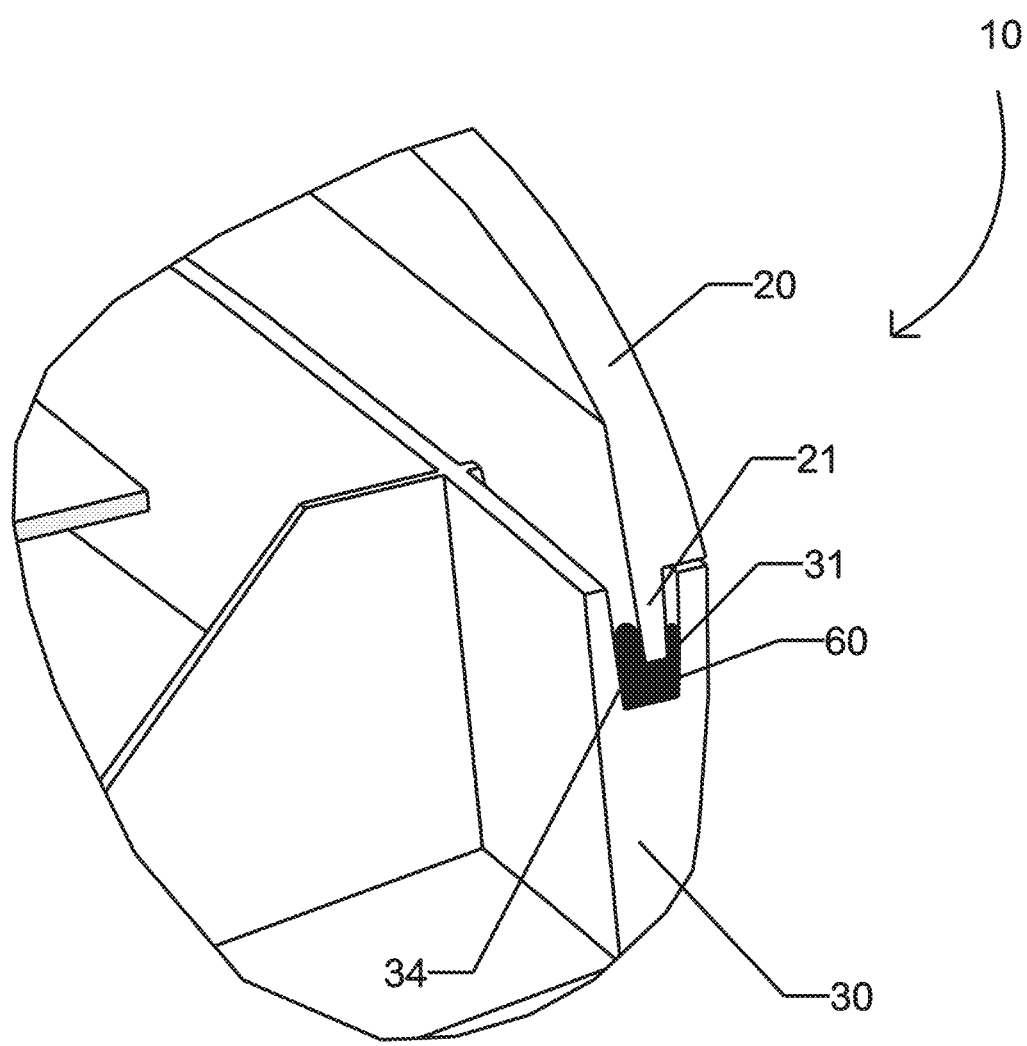
FIG. 8 is another zoomed in sectional side view of part of the radome of FIG. 1 depicting the location of an adhesive sealant.

Referring to FIG. 8, in one embodiment, the peripheral channel region 31 is substantially a U-shaped recess. The U-shaped recess is located at the periphery of the front portion 30. The recess 31 may be symmetrically shaped having a flat section at its blind end. The sides of the recess 31 may be slanted from a larger open end to a narrower blind end.

The radome 10 is formed by sealing together and permanently bonding the two halves 20, 30 using the combination of adhesive sealant 60 and the mechanical clips 23, 33. The sealed and bonded radome 10 prevents the ingress of moisture and the detachment of the front and rear portions 20, 30 after prolonged use.

Figure 9:
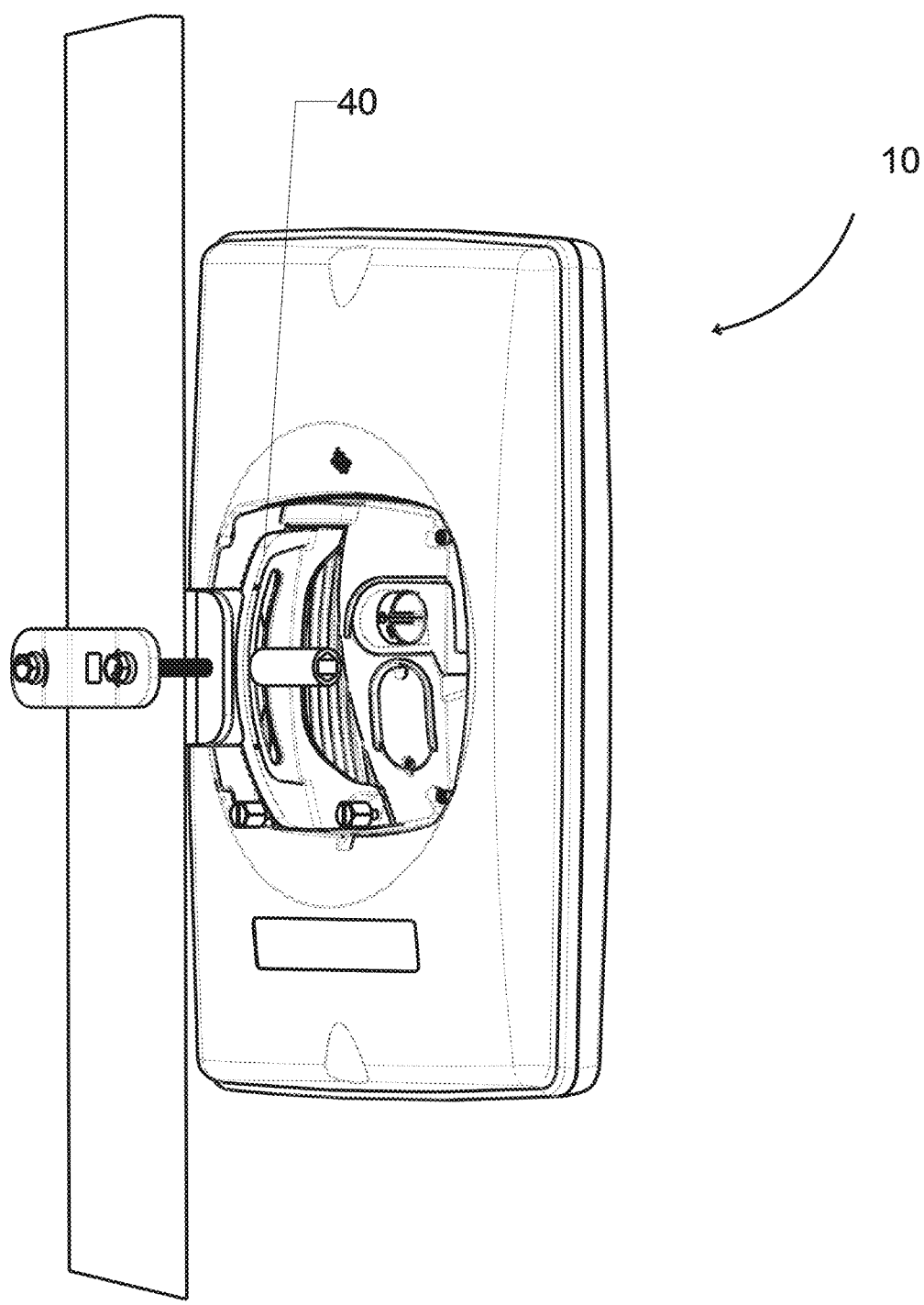
FIG. 9 is a photo of a radome with an antenna (as manufactured in accordance with the first embodiment of the invention) mounted to a pole.
Figure 10:
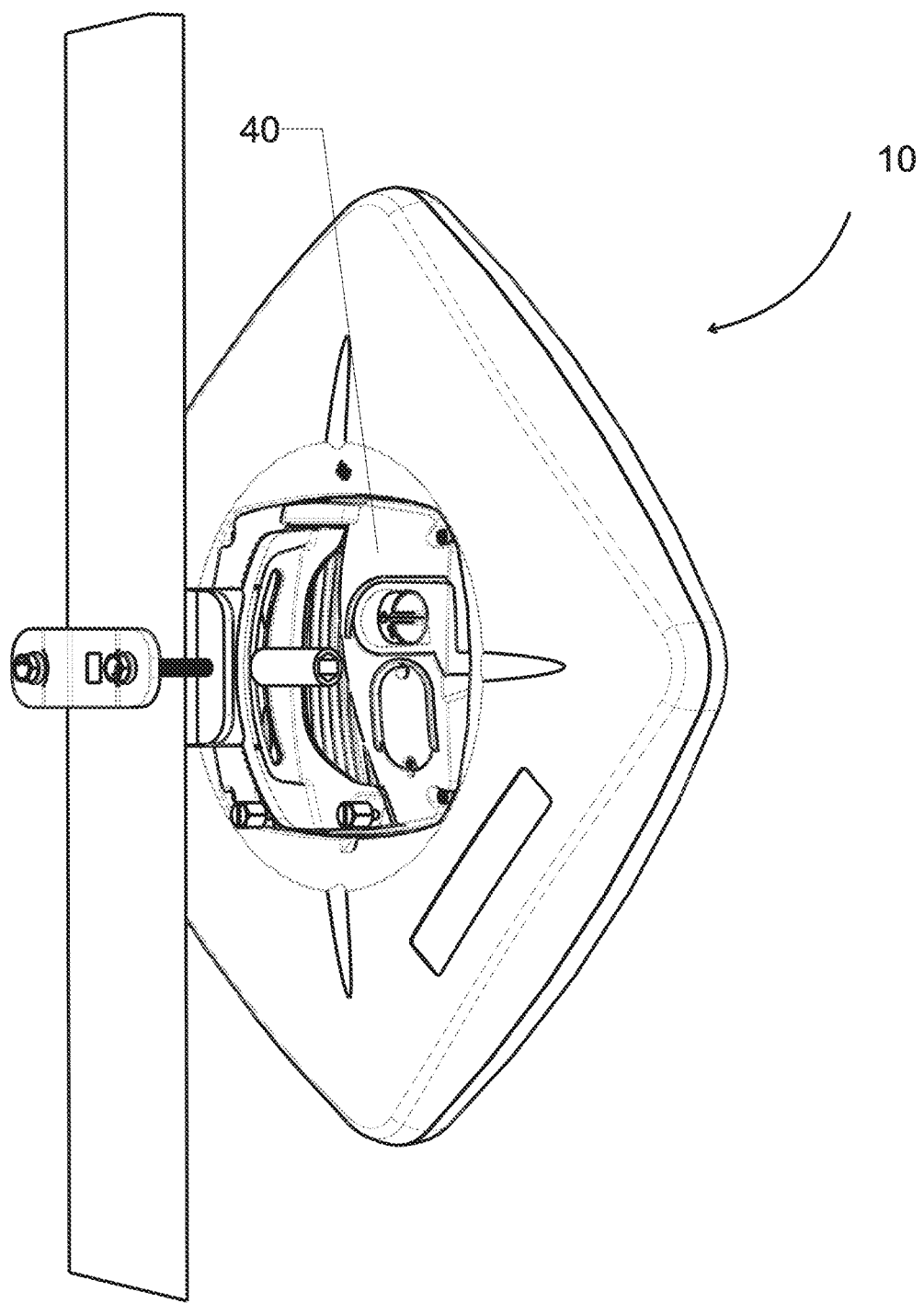
FIG. 10 is a photo of a radome of a second embodiment mounted to a pole.

The radome 10 may have different shapes depending on the specific application and antenna panel 50 required to be housed. Referring to FIG. 9, the radome 10 has a rectangular shape. Referring to FIG. 10, the radome 10 has a diamond shape.

Referring to FIGS. 1 and 3, the rear casting 40 has a shape that fits into the receptacle region 27 provided on the outer surface of the rear portion 20. The outer surface of the rear casting 40 is structured to aloe a height adjustable mounting bracket to be secured to the radome 10 so that the latter may be affixed to a pole (see FIGS. 9 and 10) and allow orientating of the antenna for reception and transmission optimisation. A compressible/deformable seal 41 is positioned between the lower surface of the peripheral edge of the rear casting 40 and the receptacle region 27 of the rear portion 20 to provide a waterproof seal between the lower surface of the rear casting 40 and the upper surface of the rear portion 20. The deformable seal 41 has a shape corresponding the cross-sectional outline of the rear casting 40. Four screws 42 are used to mechanically fasten the rear casting 40 to the rear portion 20 and a certain level of tightening causes the deformable seal 41 to slightly deform or compress and form the waterproof seal.

Referring to FIGS. 4 and 5, reinforcement ribs 25, 35 are provided along the inner surface of the rear portion 20 and front portion 30, respectively. The size and position of the reinforcement ribs 25, 35 are selected based on radio frequency performance required of the antenna panel 50. The use of reinforcement ribs 25, 35 enables the wall thickness of the front and rear portions 20, 30 to be reduced leading to a reduction in overall weight.

Advantageously, the radome 10 does not require two radome rubber seals between the two halves that exists in prior art radomes. Another advantage is that multiple screw fasteners to fasten the two halves are not required in the radome 10 of the present invention. Both these advantages save time for factory assembly and provide convenience.

Another advantage provided by the manufacture of an antenna module using the radome 10 disclosed herein is that there is a reduction in the material required for the two halves 20, 30, thanks to the monocoque layout, leading to less weight and lower manufacturing cost and also an increase in strength. Another reason weight is further reduced is because the groundplane for the antenna panel 50 can be made 0.8 mm thinner (44%) as there is no risk for the groundplane to be damaged by warping, bending or distorted during transit from the manufacturing site to the installation site because the antenna panel 50 is assembled within the radome 10 at the manufacturing site. The elimination of screws and radome seals and assembly labour reduces costs and decreases the overall weight of the radome 10 making it easier and safer for installers to install the radome 10 at installation sites where they may be in an elevated position and subject to windy conditions. The weight reduction of the two halves 20, 30 may be 10% compared to prior radomes, which excludes the weight reduction from removal of traditional radome seals, additional screws and additional thickness required for groundplanes with prior radomes.

Unless specified to the contrary, any and all components herein described are understood to be capable of being manufactured and, as such, may be manufactured together or separately.

Moreover, in interpreting the disclosure, all terms should be interpreted in the broadest reasonable manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

The subject headings used in the detailed description are included only for the ease of reference of the reader and should not be used to limit the subject matter found throughout the disclosure or the claims. The subject headings should not be used in construing the scope of the claims or the claim limitations.

Although the technology herein has been described with reference to particular examples, it is to be understood that these examples are merely illustrative of the principles and applications of the technology. In some instances, the terminology and symbols may imply specific details that are not required to practice the technology. For example, although the terms "first" and "second", and "upper" and "lower" have been used, unless otherwise specified, they are not intended to indicate any order or preference but are primarily utilised to distinguish between distinct elements that themselves might be similar to each other.

It is therefore to be understood that numerous modifications may be made to the illustrative examples and that other arrangements may be devised without departing from the spirit and scope of the technology.

What is claimed is:

1. A method for manufacturing an antenna, comprising:
providing a monocoque front housing-half having a peripheral edge;
providing a monocoque rear housing-half having a peripheral edge and configured to mate with the monocoque front housing-half in forming a radome with a hollow interior for an antenna arrangement, wherein the monocoque front housing-half peripheral edge is shaped to define a channel configured to receive the monocoque rear housing-half peripheral edge;
positioning an antenna panel on an inner surface of either the monocoque front housing-half or the monocoque rear housing-half;
applying a curable adhesive sealant substance within the monocoque front housing-half peripheral channel;
aligning the monocoque rear housing-half with the monocoque front housing-half such that the monocoque rear housing-half peripheral edge coincides with the monocoque front housing-half peripheral channel during a process of mating the monocoque front housing-half and the monocoque rear housing-half;
moving the monocoque front housing-half and the monocoque rear housing-half towards each other thereby at least partially submerging the monocoque rear housing-half peripheral edge in the curable adhesive sealant substance received in the monocoque front housing-half peripheral channel to form a waterproof seal and adhesively bond the monocoque front housing-half and the monocoque rear housing-half to each other once the curable adhesive sealant substance has cured; and
fully closing the radome following mating of the monocoque front housing-half and the monocoque rear housing-half by causing at least one first clip engagement member of and within the monocoque front housing-half to mechanically engage with at least one corresponding second clip engagement member of and within the monocoque rear housing-half, thereby mechanically securing the monocoque front housing-half and the monocoque rear housing-half to each other in addition to adhesive bonding provided by the cured curable adhesive sealant substance.

2. The method according to claim 1, wherein a plurality of alignment pins configured to align the monocoque front housing-half and the monocoque rear housing-half are provided on at least one of the monocoque front housing-half and the monocoque rear housing-half, the alignment pins arranged and configured to prevent accidental contact of the monocoque rear housing-half peripheral edge with the curable adhesive sealant substance unless there is alignment in the process of mating the monocoque front housing-half and the monocoque rear housing-half.

3. The method according to claim 2, wherein the at least one first clip engagement member and/or the at least one corresponding second clip engagement member have a lower height than a height of the alignment pins to such an extent that full alignment of the monocoque front housing-half to the monocoque rear housing-half occurs before mechanical engagement of the at least one first clip engagement member and/or the at least one corresponding second clip engagement member is initiated.

4. The method according to claim 1, further comprising fastening the antenna panel through holes in the monocoque rear housing-half to cause clamping of the antenna panel between the monocoque front housing-half and the monocoque rear housing-half.

5. The method according to claim 4, further comprising fitting and securing a rear casting into a receptacle region provided on an outer surface of the monocoque rear housing-half, wherein the rear casting is fitted and secured into the receptacle region such as to close the holes.

6. The method according to claim 5, further comprising positioning a compressible and/or deformable seal between a lower surface of a peripheral edge of the rear casting and the receptacle region of the monocoque rear housing-half before fitting and securing the rear casting, thereby providing a waterproof seal between the lower surface of the rear casting and an upper surface of the monocoque rear housing-half.

7. The method according to claim 5, wherein securing the rear casting into the receptacle region provided on the outer surface of the monocoque rear housing-half comprises a use of screws.

8. The method according to claim 5, further comprising connecting an adjustable mounting bracket to the rear casting either before or after the rear casting is secured to the monocoque rear housing-half, the adjustable mounting bracket configured to affix the radome to a pole to mount the antenna.

9. The method according to claim 1, wherein the monocoque front housing-half peripheral channel is a substantially U-shaped channel and the monocoque rear housing-half peripheral edge extends from an inner surface of the monocoque rear housing-half and is set back from an outer surface of the monocoque rear housing-half, the monocoque front housing-half U-shaped channel and the monocoque rear housing-half peripheral edge being complimentarily formed in such fashion that, during insertion of the monocoque rear housing-half peripheral edge into the monocoque front housing-half peripheral U-shaped channel, the curable adhesive sealant substance is displaced to surround opposite faces of the monocoque rear housing-half peripheral edge to form a waterproof seal.

10. The method according to claim 9, wherein the monocoque rear housing-half peripheral edge is biased or inclined with respect to an outer side of the monocoque front housing-half peripheral U-shaped channel is such manner that, during insertion of the monocoque rear housing-half peripheral edge into the monocoque front housing-half peripheral U-shaped channel, excess sealant received in the monocoque front housing-half peripheral U-shaped channel is pushed inwards towards the hollow interior of the radome, thereby resulting in a clean finish on an exterior surface of the radome where the monocoque front housing-half and the monocoque rear housing-half meet when the radome is closed.

11. The method according to claim 9, wherein the monocoque front housing-half peripheral U-shaped channel is formed with a blind end having a stepped portion, and wherein the monocoque rear housing-half peripheral edge is formed with a terminal base such that (i) during insertion of the monocoque rear housing-half peripheral edge into the monocoque front housing-half peripheral U-shaped channel, excess sealant received in the U-shaped channel is pushed inwardly towards the hollow interior of the radome and (ii) upon the monocoque rear housing-half peripheral edge being fully inserted into the monocoque front housing-half peripheral U-shaped channel, the terminal base abuts the stepped portion when the radome is fully closed.

12. The method according to claim 1, wherein Room-Temperature-Vulcanizing (RTV) silicone material is used as the curable adhesive sealant substance.

13. A method for manufacturing an antenna, comprising:
providing a monocoque front housing-half having a peripheral edge;
providing a monocoque rear housing-half having a peripheral edge and configured to mate with the monocoque front housing-half in forming a radome with a hollow interior for an antenna arrangement, wherein the monocoque front housing-half peripheral edge is shaped to define a channel configured to receive the monocoque rear housing-half peripheral edge;
positioning an antenna panel on an inner surface of either the monocoque front housing-half or the monocoque rear housing-half;
applying an adhesive sealant in the monocoque front housing-half peripheral channel;
aligning the monocoque rear housing-half with the monocoque front housing-half such that the monocoque rear housing-half peripheral edge coincides with the monocoque front housing-half peripheral channel during a process of mating the monocoque front housing-half and the monocoque rear housing-half;
moving the monocoque front housing-half and the monocoque rear housing-half towards each other thereby at least partially submerging the monocoque rear housing-half peripheral edge in the adhesive sealant received in the monocoque front housing-half peripheral channel to form a waterproof seal and adhesively bond the monocoque front housing-half and the monocoque rear housing-half to each other once the adhesive sealant has cured; and
fully closing the radome following mating of the monocoque front housing-half and the monocoque rear housing-half by causing at least one first clip engagement member of and within the monocoque front housing-half to mechanically engage with at least one corresponding second clip engagement member of and within the monocoque rear housing-half, thereby mechanically securing the monocoque front housing-half and the monocoque rear housing-half to each other in addition to adhesive bonding provided by the cured adhesive sealant,
wherein a plurality of alignment pins configured to align the monocoque front housing-half and the monocoque rear housing-half are provided on at least one of the monocoque front housing-half and the monocoque rear housing-half, the alignment pins arranged and configured to prevent accidental contact of the monocoque rear housing-half peripheral edge with the adhesive sealant unless there is alignment in the process of mating the monocoque front housing-half and the monocoque rear housing-half.

14. The method according to claim 13, wherein the at least one first clip engagement member and/or the at least one corresponding second clip engagement member have a lower height than a height of the alignment pins to such an extent that full alignment of the monocoque front housing-half to the monocoque rear housing-half occurs before mechanical engagement of the at least one first clip engagement member and/or the at least one corresponding second clip engagement member is initiated.

15. The method according to claim 13, further comprising fastening the antenna panel through holes in the monocoque rear housing-half to cause clamping of the antenna panel between the monocoque front housing-half and the monocoque rear housing-half.

16. The method according to claim 15, further comprising fitting and securing a rear casting into a receptacle region provided on an outer surface of the monocoque rear housing-half, wherein the rear casting is fitted and secured into the receptacle region such as to close the holes.

17. The method according to claim 16, further comprising positioning a compressible and/or deformable seal between a lower surface of a peripheral edge of the rear casting and the receptacle region of the monocoque rear housing-half before fitting and securing the rear casting, thereby providing a waterproof seal between the lower surface of the rear casting and an upper surface of the monocoque rear housing-half.

18. The method according to claim 16, wherein securing the rear casting into the receptacle region provided on the outer surface of the monocoque rear housing-half comprises a use of screws.

19. The method according to claim 16, further comprising connecting an adjustable mounting bracket to the rear casting either before or after the rear casting is secured to the monocoque rear housing-half, the adjustable mounting bracket configured to affix the radome to a pole to mount the antenna.

20. The method according to claim 15, wherein the monocoque front housing-half peripheral channel is a substantially U-shaped channel and the monocoque rear housing-half peripheral edge extends from an inner surface of the monocoque rear housing-half and is set back from an outer surface of the monocoque rear housing-half, the monocoque front housing-half U-shaped channel and the monocoque rear housing-half peripheral edge being complimentarily formed in such fashion that, during insertion of the monocoque rear housing-half peripheral edge into the monocoque front housing-half peripheral U-shaped channel, the adhesive sealant is displaced to surround opposite faces of the monocoque rear housing-half peripheral edge to form a waterproof seal.

21. The method according to claim 20, wherein the monocoque rear housing-half peripheral edge is biased or inclined with respect to an outer side of the monocoque front housing-half peripheral U-shaped channel is such manner that, during insertion of the monocoque rear housing-half peripheral edge into the monocoque front housing-half peripheral U-shaped channel, excess sealant received in the monocoque front housing-half peripheral U-shaped channel is pushed inwards towards the hollow interior of the radome, thereby resulting in a clean finish on an exterior surface of the radome where the monocoque front housing-half and the monocoque rear housing-half meet when the radome is closed.

22. The method according to claim 20, wherein the monocoque front housing-half peripheral U-shaped channel is formed with a blind end having a stepped portion, and wherein the monocoque rear housing-half peripheral edge is formed with a terminal base such that (i) during insertion of the monocoque rear housing-half peripheral edge into the monocoque front housing-half peripheral U-shaped channel, excess sealant received in the U-shaped channel is pushed inwardly towards the hollow interior of the radome and (ii) upon the monocoque rear housing-half peripheral edge being fully inserted into the monocoque front housing-half peripheral U-shaped channel, the terminal base abuts the stepped portion when the radome is fully closed.

23. The method according to claim 13, wherein Room-Temperature-Vulcanizing (RTV) silicone material is used as the adhesive sealant.

* * * * *